(12) United States Patent
Becklin

(10) Patent No.: US 7,764,497 B2
(45) Date of Patent: Jul. 27, 2010

(54) TEMPERATURE CONTROL ASSEMBLY RECEIVABLE IN A CONTAINER LID

(75) Inventor: Dennis M. Becklin, Grants Pass, OR (US)

(73) Assignee: Environmental Container Systems, Inc., Grants Pass, OR (US)

( * ) Notice: Subject to any disclaimer, the term of this patent is extended or adjusted under 35 U.S.C. 154(b) by 39 days.

(21) Appl. No.: 12/369,619

(22) Filed: Feb. 11, 2009

(65) Prior Publication Data

US 2010/0084119 A1 Apr. 8, 2010

Related U.S. Application Data

(63) Continuation-in-part of application No. 12/244,668, filed on Oct. 2, 2008, now Pat. No. 7,688,584.

(51) Int. Cl.
*H05K 7/20* (2006.01)
*F25D 17/04* (2006.01)

(52) U.S. Cl. ............. 361/697; 361/679.46; 361/679.48; 361/690; 361/714; 165/122; 62/3.6; 62/3.62; 62/457.1; 62/457.7; 62/457.9; 206/508; 206/510; 206/521; 220/324; 220/592.2

(58) Field of Classification Search ............ 361/679.01, 361/679.46, 679.48, 690–697, 714, 721–727, 361/831; 165/121–126, 104.33, 185; 174/17 R, 174/50, 520, 526, 67, 547, 548, 564; 62/3.3, 62/3.6, 3.62, 389, 371, 407, 457.1, 457.7, 62/457.9; 312/223.1, 223.2, 236, 298, 359; 454/184, 186, 187, 309, 251; 206/521, 591, 206/508–510; 220/23.9, 367.1, 324, 315, 220/592.01, 592.2; 55/385.2, 385.4

See application file for complete search history.

(56) References Cited

U.S. PATENT DOCUMENTS

| | | | | | |
|---|---|---|---|---|---|
| 4,726,193 | A | * | 2/1988 | Burke et al. | 62/457.7 |
| 4,917,256 | A | * | 4/1990 | Kruck et al. | 220/4.28 |
| 4,997,034 | A | * | 3/1991 | Steffen et al. | 165/104.34 |
| 5,160,357 | A | * | 11/1992 | Faber | 55/385.2 |
| 5,319,937 | A | * | 6/1994 | Fritsch et al. | 62/3.62 |
| 5,808,866 | A | * | 9/1998 | Porter | 361/695 |
| 6,242,691 | B1 | * | 6/2001 | Reese et al. | 174/359 |
| 6,260,360 | B1 | * | 7/2001 | Wheeler | 62/3.6 |
| 6,339,531 | B1 | * | 1/2002 | McKain et al. | 361/679.41 |
| 6,889,513 | B1 | * | 5/2005 | Clark | 62/244 |
| 2006/0174648 | A1 | * | 8/2006 | Lantz | 62/371 |
| 2008/0127668 | A1 | * | 6/2008 | DeVito et al. | 62/371 |
| 2009/0139245 | A1 | * | 6/2009 | Blackway et al. | 62/3.62 |

* cited by examiner

*Primary Examiner*—Michael V Datskovskiy
(74) *Attorney, Agent, or Firm*—Black Lowe & Graham, PLLC

(57) ABSTRACT

A transit container, such as a rack-mount style container, includes a temperature control system for maintaining a desired temperature within the container such that any cargo within the container remains operational at selected times and possibly in selected locations. The temperature control system includes support or mounting brackets, a temperature control assembly, shock isolation devices for shock attenuation of the temperature control assembly, exhaust assemblies that include exhaust fans and exhaust/intake louvers, and a mounting plate attachable to a lid of the transit container. The temperature control assembly and the aforementioned components may be arranged to have a low-height profile or envelope, which in turn permits the temperature control system to be located in a cavity or chamber of the lid.

20 Claims, 4 Drawing Sheets

TEMPERATURE CONTROL ASSEMBLY RECEIVABLE IN A CONTAINER LID

PRIORITY CLAIM

This application is a continuation-in-part of U.S. patent application Ser. No. 12/244,668 filed on Oct. 2, 2008, the subject matter of which is incorporated herein by reference in its entirety.

BACKGROUND OF THE INVENTION

Various types of transit containers, which may take the form of rack-mount style containers, are employed to receive and support delicate cargo, such as, but not limited to electronic, computer, optical and other types of equipment. These containers are often used in military and commercial environments and often are utilized in or transported into and out of areas having extreme ambient temperatures, which means the containers may be subjected to large temperature variations or a prolonged extreme temperature. Some transit containers permit the delicate equipment to be slide mounted on a frame or rack, which in turn may be supported in the container using shock absorbent devices, which may take the form of foam cushioning, elastomeric shock absorbers, or active shock absorbent systems. The transit containers may be fully enclosed, water tight, and sealed from sand, dust and chemical warfare agents.

Preferably, the transit containers are sized to efficiently receive the delicate cargo while taking up a minimum amount of transport and/or storage space. In some instances, the transit containers are configured to permit operation of the delicate cargo without its removal from the containers. As a result of the above features and depending on the environment, the rack-mount container and the electronics equipment inside may be subject to high temperatures during transportation, operation or both.

SUMMARY OF THE INVENTION

A transit container, such as a rack-mount style container, includes a temperature control system for maintaining a desired temperature within the container such that any cargo within the container remains operational at selected times and possibly in selected locations. The temperature control system includes support or mounting brackets, a temperature control assembly, shock isolation devices for shock attenuation of the temperature control assembly, exhaust assemblies, which include exhaust fans and exhaust/intake louvers, and a mounting plate attachable to a lid of the transit container. The temperature control assembly and the aforementioned components may be arranged to have a low-height profile or envelope, which in turn permits the temperature control system to be located in a cavity or chamber of the lid.

In one example of the invention, a temperature control system receivable in a lid of a transit container includes a cover plate attachable to the lid, the cover plate having at least one vent to permit airflow between an ambient environment and a cavity defined by at least the cover plate and sidewalls of the lid; a temperature control assembly sized to fit within the cavity; and at least one shock isolation device coupled to the cover plate and the temperature control assembly, the at least one shock isolation device located within the cavity and sized to transmit inertial loads from the temperature control assembly into the cover plate.

In another example of the invention, a lid for a transit container includes a cover plate attachable to the lid, the cover plate having at least one vent to permit airflow between an ambient environment and a cavity defined by at least the cover plate and sidewalls of the lid; a temperature control assembly located within the cavity, the temperature control assembly operable to maintain a desired temperature within the container; and at least one shock isolation device coupled to the temperature control assembly and the cover plate, the at least one shock isolation device located within the cavity and sized to transmit inertial loads from the temperature control assembly into the cover plate.

In yet another example of the invention, a transit container includes a lid having a plurality of sidewalls; a cover plate attachable to the lid, the cover plate having at least one vent to permit airflow between an ambient environment and a cavity defined by at least the cover plate and sidewalls of the lid; a temperature control assembly located within the cavity, the temperature control assembly operable to maintain a desired temperature within the container; and at least one shock isolation device coupled to the temperature control assembly and to the cover plate, the at least one shock isolation device located within the cavity and sized to transmit inertial loads from the temperature control assembly into the cover plate.

BRIEF DESCRIPTION OF THE DRAWINGS

The preferred and alternative embodiments of the present invention are described in detail below with reference to the following drawings.

DETAILED DESCRIPTION OF THE PREFERRED EMBODIMENT

In an example of the present invention, a transit container, which may also be referred to as a rackmount container, includes a temperature control assembly located in a lid of the transit container. The lid or lids may be attached to the side, front, back, top or bottom of the container or some combination of the above. The temperature control assembly may advantageously maintain the inside of the transit container and any cargo or equipment located therein at a controlled temperature, which may be cooler or warmer than an ambient temperature. Preferably, maintaining the controlled temperature helps to keep the cargo or equipment located in the transit container operational when desired and even during extreme conditions. In one embodiment, the lid with the temperature control assembly may be retro-fitted into earlier transit container models or designs.

Figure 1:
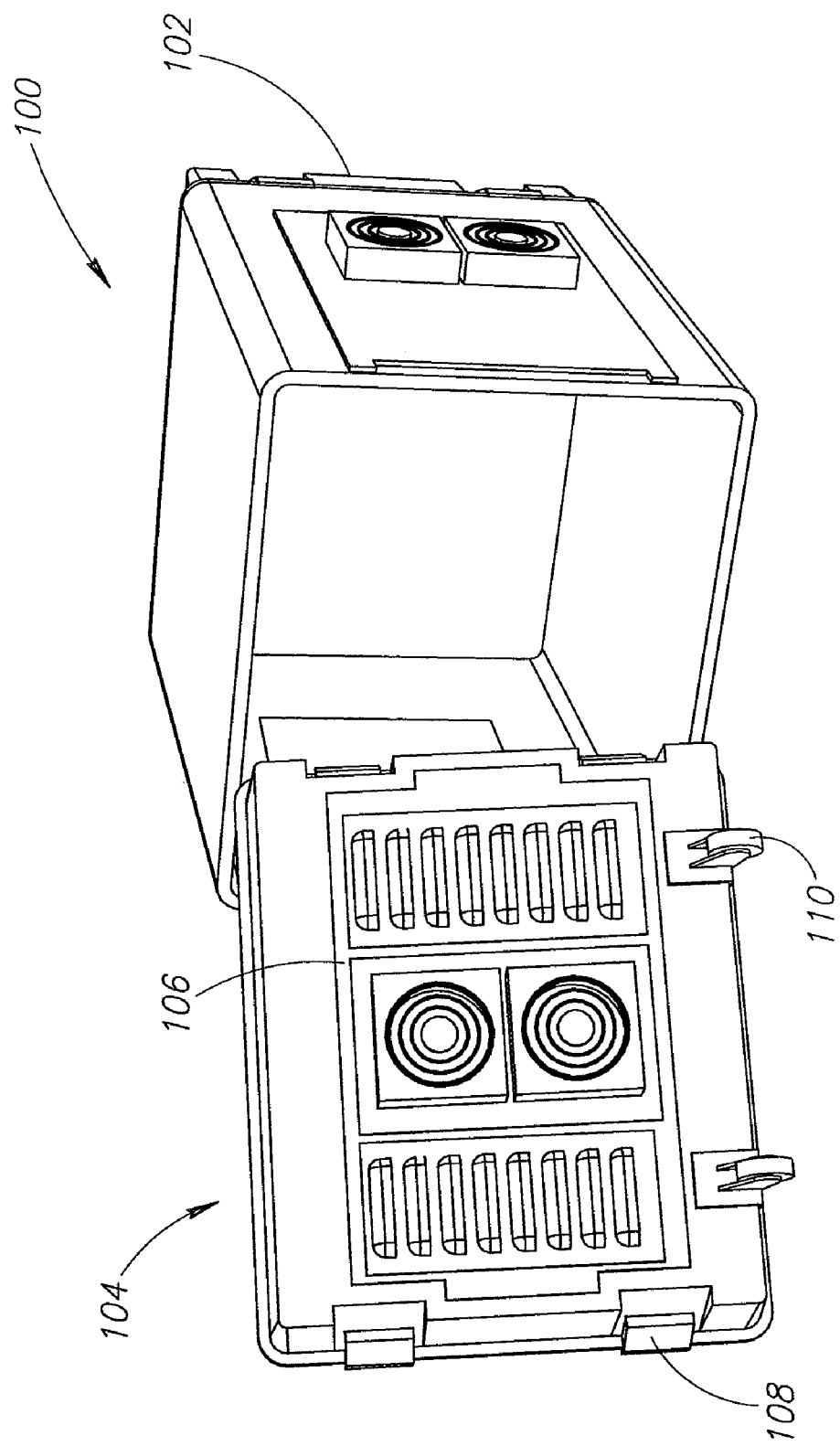
FIG. 1 shows a perspective view of a transit container with a lid according to an embodiment of the present invention.

FIG. 1 shows a transit container system 100 that includes a main case 102 and a lid 104. The lid 104 includes a temperature control assembly 106, which will be described below in greater detail. In addition, the lid 104 preferably includes latches 108 for releasably attaching to the main case 102 and may optionally include rolling devices 110, which may take the form of wheels, rollers, casters or something equivalent.

Figure 2:
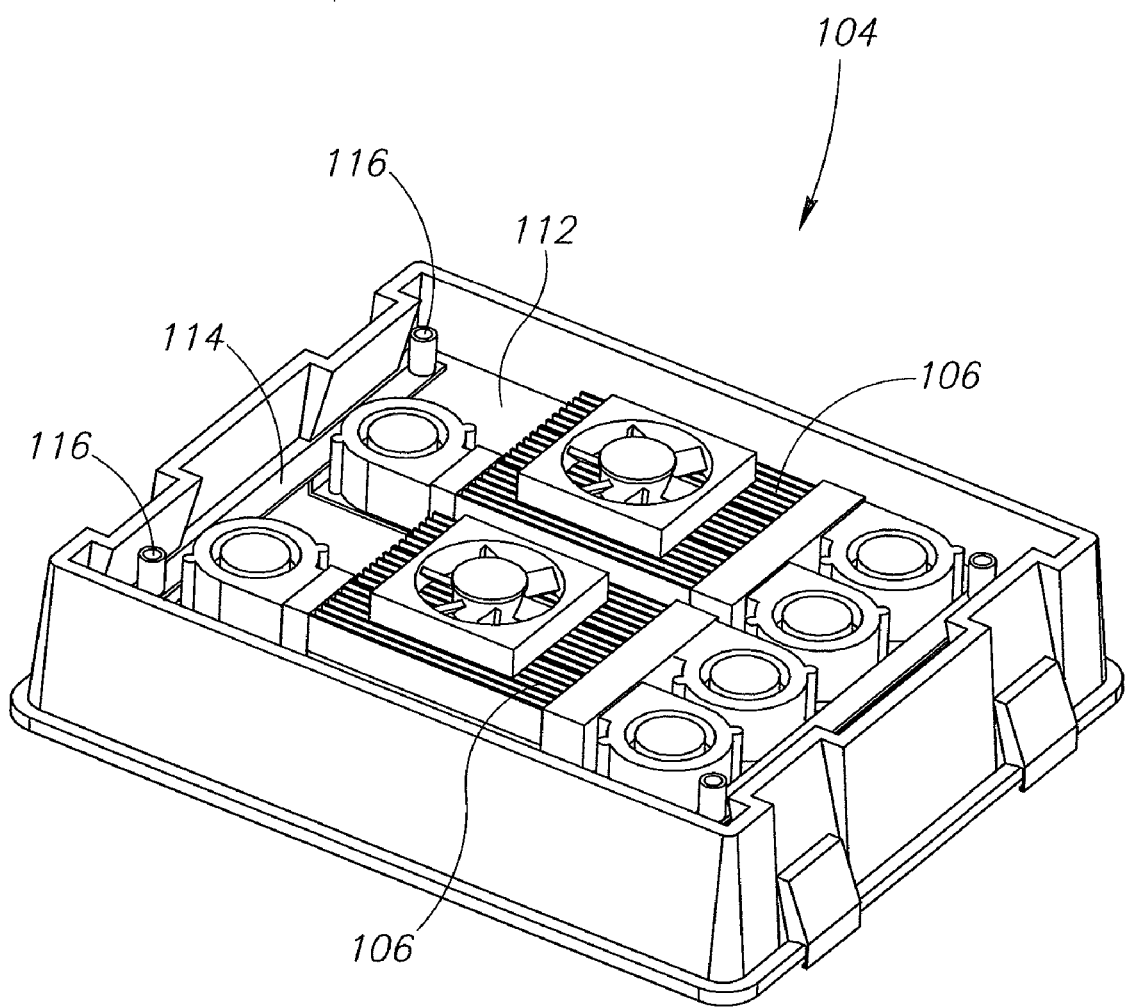
FIG. 2 shows a perspective view of a temperature control assembly located within an interior cavity formed in the lid of FIG. 1 according to an embodiment of the present invention.

FIG. 2 shows the lid 104 having a cavity 112 configured to receive at least one temperature control assembly 106, which is coupled to support blocks 114. In the illustrated embodiment, the cavity 112 receives two temperature control assemblies 106. A plurality of shock isolators 116 are coupled to the support blocks 114. By way of example, the shock isolators 116 may take the form of visco-elastic or elastomeric members that are deformable, yet able to recover to their original shape after being shock loaded. In another example, the shock isolators 116 may include metallic cores surrounded by elastomeric sleeves of a desired durometer.

Figure 3:
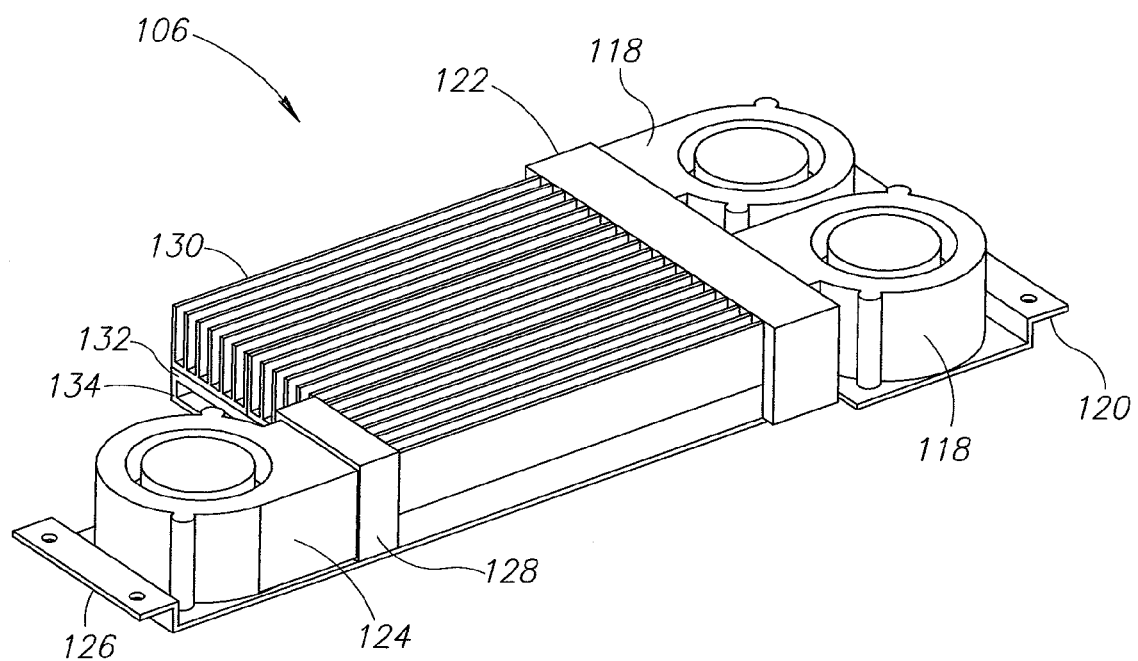
FIG. 3 shows an isometric view of the operative temperature control portions of the temperature control assembly of FIG. 2.

FIG. 3 shows the temperature control assembly 106 that operates to exchange air between an interior region of the case 102 and an ambient environment and/or circulates air within the case 102 (FIG. 1). The temperature control assembly 106 includes a low profile or a reduced thickness to fit within the cavity 112 (FIG. 2) of the lid 104 (FIG. 2). By way of example in the illustrated embodiment, the temperature control assembly 106 includes a pair of hot side blowers 118 supported by a hot side support bracket 120 and a hot side support member 122. Distally located from the hot side support bracket 120 is a cold side blower 124 supported by a cold side support bracket 126 and a cold side support member 128. Positioned between the hot and cold side support members 122, 128 is a heat exchanger 132 located under a heat sink 130, which in turn is located on top of an air exchange manifold 134. The heat sink 130 may take the form of an air-cooled heat exchanger with cooling fins configured to provide a large surface area to extract heat from the air being cooled as it moves through the manifold 134 by operation of the blowers 118, 124. It is appreciated that the temperature control assembly 106 may be modular in nature in that a different number of blowers, cooling fins for the heat exchanger, support brackets, support members, heat sinks, and manifolds may be employed in the temperature control assembly 106 without deviating from the spirit and scope of the present invention.

Figure 4:
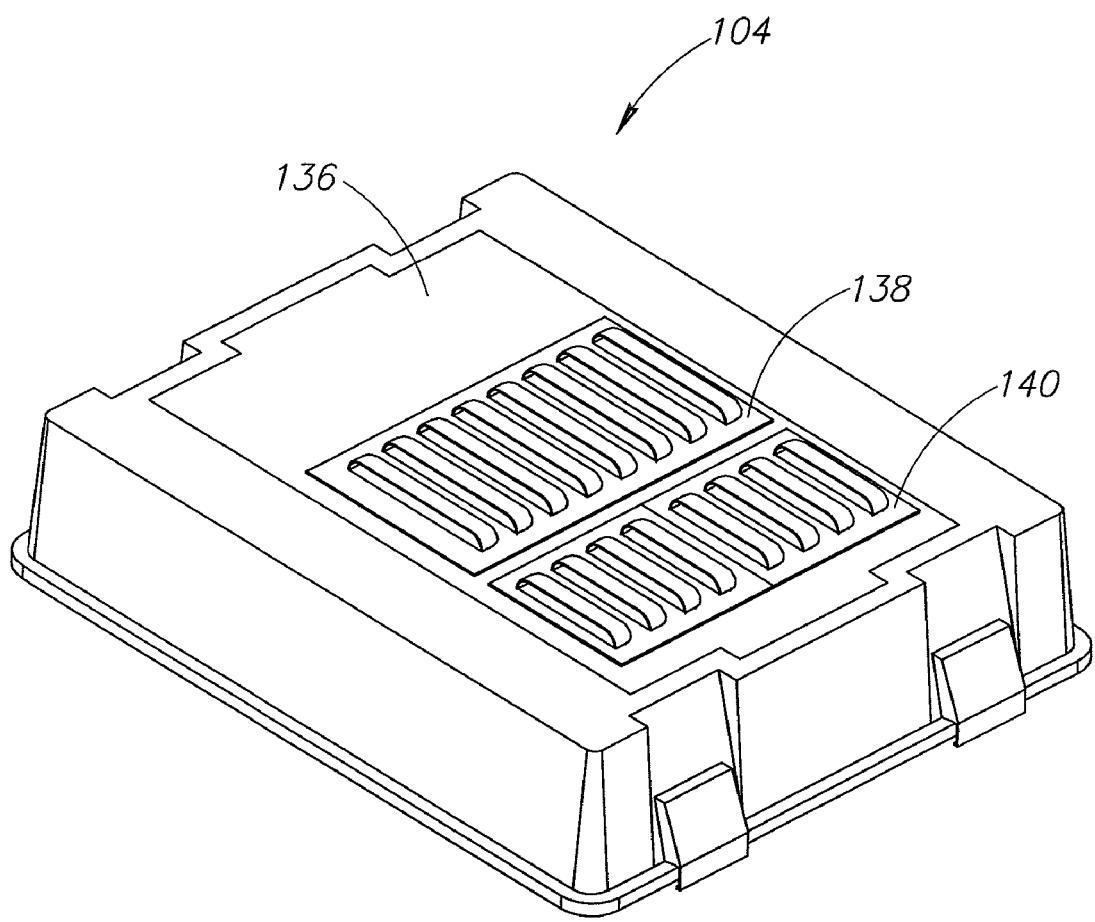
FIG. 4 shows an isometric view of another lid with a cover plate attached to the lid.

FIG. 4 shows the lid 104 with an exterior mounting plate 136 attached thereto. The mounting plate 136 may be attached using a variety of mechanical fastening methods, such as, but not limited to, fasteners, bonding agent, an interference fit or even a snap fit with molded protrusions formed in the lid. In the illustrated embodiment, louvers 138, 140 are attached to the mounting plate 136 and are in fluid communication with openings provided in the mounting plate 136. The louvers 138 may operate as exhaust louvers to allow air to be removed from the case 102 (FIG. 1) while the louvers 140 may operate as intake louvers to allow air to be pulled or drawn into the case 102 (FIG. 1). Filters (not shown) may be located proximate the louvers 138, 140 to scrub the air moving into or out of the case 102 (FIG. 1). The arrangement and orientation of the louvers 138, 140 may be selected to optimize the air flow based on the intended purpose of the case 102 (FIG. 1).

While the preferred embodiment of the invention has been illustrated and described, as noted above, many changes can be made without departing from the spirit and scope of the invention. Accordingly, the scope of the invention is not limited by the disclosure of the preferred embodiment. Instead, the invention should be determined entirely by reference to the claims that follow.

The embodiments of the invention in which an exclusive property or privilege is claimed are defined as follows:

1. A temperature control system receivable in a lid of a transit container, the temperature control system comprising:
a cover plate attachable to the lid, the cover plate having at least one vent to permit airflow between an ambient environment and a cavity defined by at least the cover plate and sidewalls of the lid;
a temperature control assembly sized to fit within the cavity; and
at least one shock isolation device coupled to the cover plate and the temperature control assembly, the at least one shock isolation device located within the cavity and sized to transmit inertial loads from the temperature control assembly into the cover plate.

2. The system of claim 1, wherein the at least one vent includes a louver coupled to the cover plate, the louver having openings to permit airflow in a desired direction through the cavity.

3. The system of claim 2, further comprising a filter aligned with the openings in the louver.

4. The system of claim 2, wherein the louver is an intake louver.

5. The system of claim 2, wherein the louver is an exhaust louver.

6. The system of claim 1, further comprising a structural support unit positioned between the at least one shock isolation device and the cover plate.

7. The system of claim 6, wherein the structural support unit includes structural support blocks coupled to the at least one shock isolation device and support brackets positioned between the structural support blocks and the temperature control assembly.

8. The system of claim 1, wherein the temperature control assembly maintains a desired temperature within the container.

9. The system of claim 1, wherein the at least one shock isolation device includes an elastomeric member with a selected durometer.

10. The system of claim 1, wherein the temperature control assembly includes at least one heat sink in fluid communication with a first blower and at least one manifold in fluid communication with a second blower.

11. The system of claim 1, wherein the at least one shock isolation device located within the cavity and is sized to transmit inertial loads from the temperature control assembly into the cover plate.

12. A lid for a transit container, the lid comprising:
a cover plate attachable to the lid, the cover plate having at least one vent to permit airflow between an ambient environment and a cavity defined by at least the cover plate and sidewalls of the lid;
a temperature control assembly located within the cavity, the temperature control assembly operable to maintain a desired temperature within the container; and
at least one shock isolation device coupled to temperature control assembly and the cover plate, the at least one shock isolation device located within the cavity and sized to transmit inertial loads from the temperature control assembly into the cover plate.

13. The lid of claim 12, wherein the at least one vent includes a louver coupled to the cover plate, the louver having openings to permit airflow in a desired direction through the cavity.

14. The lid of claim 12, wherein the temperature control assembly includes at least one heat sink in fluid communication with a first blower and at least one manifold in fluid communication with a second blower.

15. The lid of claim 12, wherein the at least one shock isolation device includes an elastomeric member with a selected durometer.

16. The lid of claim 12, further comprising a plurality of latches coupled to the lid, the latches operable to secure the lid to a main body of the transit container.

17. A transit container comprising:

a lid having a plurality of sidewalls;

a cover plate attachable to the lid, the cover plate having at least one vent to permit airflow between an ambient environment and a cavity defined by at least the cover plate and sidewalls of the lid;

a temperature control assembly located within the cavity, the temperature control assembly operable to maintain a desired temperature within the container; and at least one shock isolation device coupled to the temperature control assembly and to the cover plate, the at least one shock isolation device located within the cavity and sized to transmit inertial loads from the temperature control assembly into the cover plate.

18. The system of claim 17, further comprising a structural support unit positioned between the at least one shock isolation device and the cover plate.

19. The system of claim 18, wherein the structural support unit includes structural support blocks coupled to the at least one shock isolation device and support brackets positioned between the structural support blocks and the temperature control assembly.

20. The system of claim 17, wherein the temperature control assembly includes at least one heat sink in fluid communication with a first blower and at least one manifold in fluid communication with a second blower.

* * * * *